United States Patent
Hirayama

(10) Patent No.: US 10,324,255 B2
(45) Date of Patent: Jun. 18, 2019

(54) PHOTOSENSITIVE EPOXY RESIN COMPOSITION FOR FORMATION OF OPTICAL WAVEGUIDE

(71) Applicant: NITTO DENKO CORPORATION, Ibaraki-shi, Osaka (JP)

(72) Inventor: Tomoyuki Hirayama, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 15/580,778

(22) PCT Filed: Jun. 3, 2016

(86) PCT No.: PCT/JP2016/066655
§ 371 (c)(1),
(2) Date: Dec. 8, 2017

(87) PCT Pub. No.: WO2016/203999
PCT Pub. Date: Dec. 22, 2016

(65) Prior Publication Data
US 2018/0224600 A1    Aug. 9, 2018

(30) Foreign Application Priority Data
Jun. 18, 2015  (JP) ................................. 2015-122724

(51) Int. Cl.
*G02B 6/12* (2006.01)
*H05K 1/02* (2006.01)
*C08L 63/00* (2006.01)
*H05K 1/03* (2006.01)
*G02B 6/122* (2006.01)

(52) U.S. Cl.
CPC ................ *G02B 6/12* (2013.01); *C08L 63/00* (2013.01); *G02B 6/1221* (2013.01); *H05K 1/02* (2013.01); *H05K 1/0274* (2013.01); *H05K 1/0393* (2013.01)

(58) Field of Classification Search
CPC ......... C08L 63/00; G02B 6/1221; G02B 6/12; H05K 1/02; H05K 1/0274; H05K 1/0393
See application file for complete search history.

(56) References Cited

U.S. PATENT DOCUMENTS

| | | | |
|---|---|---|---|
| 2004/0258913 A1 | 12/2004 | Lu | |
| 2009/0196559 A1* | 8/2009 | Makino | C08F 265/00 385/126 |
| 2010/0150510 A1* | 6/2010 | Sato | G02B 6/1221 385/130 |
| 2010/0209042 A1* | 8/2010 | Makino | G02B 6/136 385/14 |
| 2011/0280531 A1 | 11/2011 | Hirayama | |
| 2012/0033913 A1 | 2/2012 | Kondou et al. | |
| 2016/0070029 A1 | 3/2016 | Hirayama | |
| 2016/0238788 A1 | 8/2016 | Hirayama | |
| 2016/0252811 A1 | 9/2016 | Hirayama | |

FOREIGN PATENT DOCUMENTS

| | | |
|---|---|---|
| JP | 2001-281475 A | 10/2001 |
| JP | 2003-105118 A | 4/2003 |
| JP | 2010-230944 A | 10/2010 |
| JP | 2011-27903 A | 2/2011 |
| JP | 2011-237645 A | 11/2011 |
| WO | 2014/174924 A1 | 10/2014 |
| WO | 2015/068593 A1 | 5/2015 |
| WO | 2015/068594 A1 | 5/2015 |

OTHER PUBLICATIONS

International Search Report dated Sep. 6, 2016, issued in Counterpart of International Application No. PCT/JP2016/066655 (2 pages).
Notification of Transmittal of Translation of the International Preliminary Report on Patentability (Form PCT/IB/338) issued in counterpart International Application No. PCT/JP2016/066655 dated Dec. 28, 2017, with Forms PCT/IB/373 and PCT/ISA/237. (7 pages).
Office Action dated Mar. 19, 2019, issued in counterpart JP application No. 2015-122724, with English translation. (6 pages).

* cited by examiner

*Primary Examiner* — Thomas A Hollweg
*Assistant Examiner* — Mary A El-Shammaa
(74) *Attorney, Agent, or Firm* — Westerman, Hattori, Daniels & Adrian, LLP

(57) ABSTRACT

The present disclosure provides an optical waveguide formation photosensitive epoxy resin composition which contains an epoxy resin and a photo-cationic polymerization initiator, wherein the epoxy resin includes a solid epoxy resin component alone. Thus, a core layer forming material can be provided, which has higher R-to-R (roll-to-roll) adaptability and higher transparency at a wavelength of 850 nm. Therefore, a core layer for an optical waveguide can be formed as having excellent R-to-R adaptability, higher transparency and a lower loss by using the optical waveguide formation photosensitive epoxy resin composition without changing the conventional production process.

10 Claims, No Drawings

PHOTOSENSITIVE EPOXY RESIN COMPOSITION FOR FORMATION OF OPTICAL WAVEGUIDE

TECHNICAL FIELD

The present invention relates to an optical waveguide formation photosensitive epoxy resin composition and an optical waveguide formation photosensitive film to be used as a material for formation of a core layer or the like of an optical waveguide in an optical/electrical transmission hybrid flexible printed wiring board which is widely used for optical communications, optical information processing and other general optics. The invention further relates to an optical waveguide produced by using the epoxy resin composition or the photosensitive film, and to a hybrid flexible printed wiring board for optical/electrical transmission.

BACKGROUND ART

Conventional optical waveguide formation materials for hybrid flexible printed wiring boards for optical/electrical transmission employ photosensitive epoxy resin compositions. Where a core layer is formed in a predetermined pattern by using any of the photosensitive epoxy resin compositions, for example, the formation of the predetermined core pattern is achieved by irradiation with ultraviolet radiation (UV) via a photomask.

Such a photosensitive epoxy resin composition has high photocurability, but is disadvantageous in that the photosensitive epoxy resin composition cannot be employed for a continuous process such as an R-to-R (roll-to-roll) process because of the surface tackiness of a coating film of the photosensitive epoxy resin composition (the film of the photosensitive epoxy resin composition is liable to be broken when being brought into contact with a roll) and, therefore, the productivity is poorer (PTL 1). Therefore, a resin component that is solid at room temperature is generally used as a photosensitive resin for R-to-R adaptability. As the molecular weight of the resin component becomes higher, the flexibility of an uncured amorphous film of the resulting resin composition is increased, but the patterning resolution is reduced. As the molecular weight of the resin component becomes lower, on the other hand, the patterning resolution is increased, but the flexibility of the resulting resin composition is reduced. Problematically, the flexibility and the patterning resolution of the film are in tradeoff relation. Therefore, there is a demand for an optical waveguide material which satisfies the requirements for both the flexibility and the patterning resolution of the film. For example, a resin composition containing an epoxy-containing acryl rubber, urethane (meth)acrylate or a (meth)acrylate free from a urethane bond is proposed as a cladding layer forming material for an optical waveguide (PTL 2).

Incidentally, the optical waveguide core layer forming material needs to satisfy requirements for various physical properties such as higher refractive index, higher transparency, higher-resolution patternability and higher heat resistance when being cured according to its use purpose. Therefore, makers conduct studies to prepare a forming material satisfying the aforementioned property requirements by selecting proper ingredients and determining a balanced formulation in production of the optical waveguide.

In the aforementioned R-to-R process for mass production, a dry film technique is generally employed in which the uncured film is used in a dry film form. In development of the material, requirements for process adaptability of the dry film material (e.g., lower tackiness and flexibility of the uncured film) consequently reduces the material design flexibility. In addition to the reduction in material design flexibility, the need for provision of lamination bases on opposite surfaces of the film is problematic for resource saving and costs in the formation of the dry film. Therefore, the adaptability to a wet process is also regarded as important in the development of the material (PTL 3).

In view of such technical background, a photosensitive epoxy resin composition satisfying the aforementioned property requirements has been developed, for example, by using a specific novolak polyfunctional epoxy resin as a base material and adding various resins to the epoxy resin (PTL 4).

RELATED ART DOCUMENT

Patent Document

PTL 1: JP-A-2001-281475
PTL-2: JP-A-2011-27903
PTL 3: JP-A-2010-230944
PTL 4: JP-A-2011-237645

SUMMARY OF INVENTION

The optical waveguide formation material for the optical/electrical transmission hybrid board is required to have higher transparency out of the aforementioned property requirements. However, the specific novolak polyfunctional epoxy resin is liable to be significantly yellowed by electron transition absorption and, therefore, is insufficient in function due to a light transmission loss.

For the R-to-R process adaptability, a small amount of a liquid component is generally added as a plasticizer to the material to impart the uncured film with proper flexibility in the material design. The uncured film often unexpectedly suffers from tackiness due to temperature change caused by a production environmental factor (particularly a seasonal factor or the like), resulting in film breakage. If the liquid component is not added for prevention of film breakage, the resulting film is liable to lose its flexibility, resulting in a tradeoff such as cracking.

Further, if a cured film is bent on a low-temperature metal roll with a tensile stress applied thereto, the cured film often suffers from cracking.

To cope with this, there is a demand for a core layer forming material which is highly transparent and has proper R-to-R adaptability in the wet process without the need for changing the conventional production process.

In view of the foregoing, it is an object to provide an optical waveguide formation photosensitive epoxy resin composition and an optical waveguide formation photosensitive film to be used as a core layer forming material having higher R-to-R adaptability and higher transparency (e.g., higher transparency at a wavelength of 850 nm), and to provide an optical waveguide produced by using the photosensitive epoxy resin composition or the photosensitive film and a hybrid flexible printed wiring board for optical/electrical transmission.

According to a first inventive aspect to achieve the above object, there is provided a photosensitive photocurable epoxy resin composition for formation of an optical waveguide, the epoxy resin composition containing an epoxy resin and a photo-cationic polymerization initiator, wherein the epoxy resin includes a solid epoxy resin component alone.

According to a second inventive aspect, there is provided an optical waveguide formation photosensitive film which is produced by forming the photosensitive epoxy resin composition of the first inventive aspect into a film.

According to a third inventive aspect, there is provided an optical waveguide, which includes a substrate, a cladding layer provided on the substrate and a core layer provided in a predetermined pattern in the cladding layer for transmission of an optical signal, wherein the core layer is a core layer formed by curing the photosensitive epoxy resin composition of the first inventive aspect or the photosensitive film of the second inventive aspect.

According to a fourth inventive aspect, there is provided a hybrid flexible printed wiring board for optical/electrical transmission, which includes the optical waveguide of the third inventive aspect.

The inventor conducted intensive studies to provide a photosensitive epoxy resin composition which has proper R-to-R adaptability, higher transparency and a lower loss for use as an optical waveguide core layer forming material. As a result, the inventor found that, where the epoxy resin including the aforementioned solid epoxy resin component alone is used, the intended object can be achieved.

(1) R-to-R Adaptability (Flexibility of Uncured Film

The inventor employs a solid epoxy resin alone as the epoxy resin, and focuses on the softening point of the solid epoxy resin in a preferred embodiment. In general, the resin has flexibility attributable to toughness thereof caused by entanglement of molecules thereof and diversified possible conformations of main chains of the molecules thereof. A solid epoxy resin having a higher softening point and having a molecular weight higher than a certain level exhibits higher flexibility in an uncured state. This is attributable to the fact that the higher molecular weight resin has a higher degree of entanglement (interaction) of the main chains thereof. However, a varnish of the resin composition having such a formulation is liable to have a higher viscosity, resulting in the need for use of an excess amount of a solvent component. Therefore, the varnish is not suitable for formation of a thicker coating film, and is liable to be poorer in patternability.

On the other hand, a material having a lower softening point is expected to have higher flexibility due to diversified possible conformations of main chains of molecules thereof without the influence of interaction of the main chains because the main chains are weakly entangled. A material having a softening point of a middle temperature range between a higher temperature range and a lower temperature range is significantly influenced by the drawbacks of the higher-softening point material and the lower-softening point material, and tends to have poorer flexibility.

In the present disclosure, the solid epoxy resin is used, thereby making it possible to impart the epoxy resin composition with flexibility in the uncured state without addition of a liquid component.

(2) Refractive Index

A higher refractive index is an indispensable property of the optical waveguide core layer forming material. In the material design, the resin is generally imparted with a higher refractive index mainly by adding a nanofiller, a heavy element-containing monomer or a fluorene skeleton-containing monomer. Particularly, the fluorene skeleton-containing monomer is used for less expensive material design. In general, however, the fluorene skeleton-containing monomer has a limited choice, and may be either a higher-viscosity liquid monomer or a higher-crystallinity monomer. The higher-viscosity liquid monomer, which is liable to cause tackiness, cannot be used. The higher-crystallinity monomer is liable to suffer from recrystallization when being used in a greater proportion for the resin component. This reduces the pot life of the resulting varnish. Therefore, the upper limit of the refractive index is preferably about 1.59 in order to less expensively impart the resin composition with a higher refractive index. Thus, the resin composition can function as the optical waveguide core layer forming material. In the present disclosure, a solid fluorene skeleton-containing epoxy resin having a higher crystallinity is preferably used from the viewpoint of the higher refractive index and the pot life. This makes it possible to easily impart the resin composition with excellent properties for the core layer function.

(3) Linear Loss

A cresol novolak epoxy resin, a bisphenol-A epoxy resin and a fluorene skeleton-containing epoxy resin, which each have a lower hue, are preferably used as the material. Particularly, the cresol novolak resin, which has lower fourth overtone absorption attributable to absorption of vibrations of an aromatic ring at a wavelength of 850 nm, is used as a base resin, thereby making it possible to provide a lower loss effect.

(4) Varnish Stability

For the stability of the varnish, the solid resin component is used alone as the resin. In the present disclosure, the fluorene skeleton-containing epoxy resin is preferably used in a proportion of 15 to 20 parts by weight without the introduction of the crystalline fluorene monomer, which may otherwise result in the recrystallization as described for the refractive index. This makes it possible to easily maintain the stability of the varnish.

The physical property requirements can be more easily satisfied by thus using the solid epoxy resin component alone as the epoxy resin to satisfy all the aforementioned items, more preferably by selecting ingredients for the epoxy resin composition and determining the proportions of the selected ingredients.

According to the present disclosure, the optical waveguide formation photosensitive epoxy resin composition is provided which contains the solid epoxy resin component alone as the epoxy resin. Therefore, where the optical waveguide formation photosensitive epoxy resin composition is used for formation of the core layer of the optical waveguide, the core layer can be formed as having excellent R-to-R adaptability, higher transparency and a lower loss without changing the conventional production process.

Where the epoxy resin includes: (a) a solid cresol novolak epoxy resin; (b) a solid bisphenol-A epoxy resin; and (c) a solid fluorene skeleton-containing epoxy resin, the core layer can be formed as having more excellent R-to-R adaptability, higher transparency and a lower loss.

Where the solid cresol novolak epoxy resin (a), the solid bisphenol-A epoxy resin (b) and the solid fluorene skeleton-containing epoxy resin (c) are respectively present in predetermined proportions on a weight basis in the epoxy resin, the core layer can be formed as having more excellent R-to-R adaptability, higher transparency and a lower loss.

Where the solid cresol novolak epoxy resin (a) has a softening point of not higher than 65° C., the core layer can be formed as having more excellent R-to-R adaptability.

Where the solid bisphenol-A epoxy resin (b) has a softening point of not higher than 80° C., the core layer can be formed as having more excellent R-to-R adaptability.

DESCRIPTION OF EMBODIMENTS

Next, embodiments of the present disclosure will be described in detail. However, it should be understood that the present disclosure be not limited to these embodiments.

<<Photosensitive Epoxy Resin Composition for Formation of Optical Waveguide>>

An inventive photosensitive epoxy resin composition for formation of an optical waveguide (hereinafter sometimes referred to simply as "photosensitive epoxy resin composition") is prepared by using a specific resin component and a photo-cationic polymerization initiator. In the present disclosure, the specific resin component includes a solid epoxy resin component alone. In the present disclosure, the term "liquid" or "solid" means that a substance is fluid in a "liquid" state or nonfluid in a "solid" state at room temperature (25° C.±5° C.). In the present disclosure, the term "room temperature" means a temperature range of 25° C.±5° C. as described above.

The ingredients will hereinafter be described one by one.

<Specific Resin Component>

The specific resin component includes the solid epoxy resin component alone as described above. For excellent R-to-R adaptability, higher transparency and a lower loss, more specifically, the solid epoxy resin component preferably includes the following three epoxy resins: (a) a solid cresol novolak epoxy resin; (b) a solid bisphenol-A epoxy resin; and (c) a solid fluorene skeleton-containing epoxy resin.

The cresol novolak epoxy resin (a) is solid at room temperature, and an example thereof is a cresol novolak epoxy resin represented by the following general formula (1):

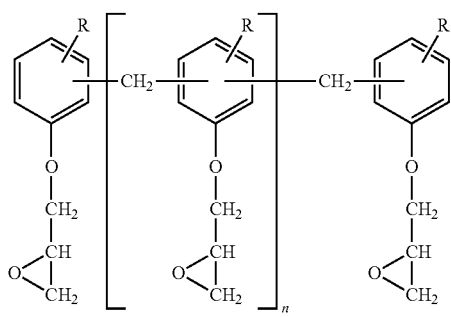

wherein Rs, which may be the same or different, are each a C1 to C6 alkyl group, and n is a positive number.

In the formula (1), Rs are preferably all methyl groups.

Specific examples of the cresol novolak epoxy resin represented by the above general formula (1) include YDCN-704A, YDCN-700-10, YDCN-700-7, YDCN-700-5 and YDCN-700-3 (all available from Nippon Steel & Sumikin Chemical Co., Ltd.), which may be used alone or in combination.

The solid cresol novolak epoxy resin (a) preferably has a softening point of not higher than 65° C., more preferably 55° C. to 65° C. If the softening point is excessively high, the R-to-R adaptability tends to be reduced.

The solid bisphenol-A epoxy resin (b) is solid at room temperature, and specific examples thereof include long-chain bifunctional aromatic bisphenol-A epoxy resins JER1002, JER1003, JER1004, JER1007 and JER1010 (all available from Mitsubishi Chemical Corporation), which may be used alone or in combination.

The solid bisphenol-A epoxy resin (b) preferably has a softening point of not higher than 80° C., more preferably 65° C. to 78° C. If the softening point is excessively high, the R-to-R adaptability tends to be reduced.

The solid fluorene skeleton-containing epoxy resin (c) is a solid epoxy resin which is solid at room temperature and has a fluorene skeleton at its main chain. An example of the solid fluorene skeleton-containing epoxy resin (c) is an epoxy resin represented by the following general formula (2):

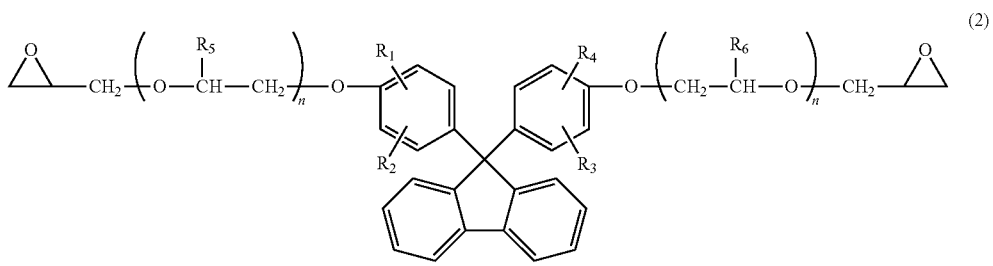

wherein $R_1$ to $R_4$, which may be the same or different, are each a hydrogen atom or a C1 to C6 alkyl group; $R_5$ and $R_6$, which may the same or different, are each a hydrogen atom or a methyl group; and n is independently an integer of 0 to 10.

In the formula (2), $R_1$ to $R_6$ are preferably all hydrogen atoms. A specific example of such an epoxy resin is OGSOL PG-100 (available from Osaka Gas Chemicals Co., Ltd.)

As the specific resin component, the solid cresol novolak epoxy resin (a), the solid bisphenol-A epoxy resin (b) and the solid fluorene skeleton-containing epoxy resin (c) are present in proportions of (a) 40 to 60 parts by weight, (b) 20 to 40 parts by weight and (c) 15 to 20 parts by weight, respectively, more preferably (a) 50 to 60 parts by weight, (b) 25 to 35 parts by weight and (c) 18 to 20 parts by weight, respectively, based on 100 parts by weight of the total weight (a)+(b)+(c) of the epoxy resins (a), (b) and (c). If the proportion of the solid cresol novolak epoxy resin (a) is excessively small, the light transmission loss tends to be reduced. If the proportion of the solid cresol novolak epoxy resin (a) is excessively great, it will be impossible to provide a proper function balance. If the proportion of the solid bisphenol-A epoxy resin (b) is excessively small, the resulting cured product tends to have lower flexibility. If the proportion of the solid bisphenol-A epoxy resin (b) is excessively great, the light transmission loss tends to be reduced. If the proportion of the solid fluorene skeleton-containing epoxy resin (c) is excessively small, the refractive index tends to be insufficient. If the proportion of the solid fluorene skeleton-containing epoxy resin (c) is excessively great, the pot life tends to be deteriorated.

Although the solid epoxy resin component preferably includes the solid cresol novolak epoxy resin (a), the solid bisphenol-A epoxy resin (b) and the solid fluorene skeleton-containing epoxy resin (c) in the present disclosure, the solid epoxy resin component may include a solid epoxy resin other than the epoxy resins (a), (b) and (c). More preferably, the epoxy resins (a), (b) and (c) account for not less than 80 wt. % of the overall solid epoxy resin component. Particularly preferably, the solid epoxy resin component includes the three epoxy resins alone, i.e., the solid cresol novolak epoxy resin (a), the solid bisphenol-A epoxy resin (b) and the solid fluorene skeleton-containing epoxy resin (c).

<Photo-Cationic Polymerization Initiator>

The photo-cationic polymerization initiator (photoacid generator) is used to impart the photosensitive epoxy resin composition with photocurability, e.g., curability by irradiation with ultraviolet radiation.

Examples of the photo-cationic polymerization initiator include triphenylsulfonium hexafluoroantimonate, triphenylsulfonium hexafluorophosphate, p-(phenylthio)phenyldiphenylsulfonium hexafluoroantimonate, p-(phenylthio)phenyldiphenylsulfonium hexafluorophosphate, 4-chlorophenyldiphenylsulfonium hexafluorophosphate, 4-chlorophenyldiphenylsulfonium hexafluoroantimonate, bis[4-diphenylsulfonio]phenyl]sulfide bishexafluorophosphate, bis[4-(diphenylsulfonio)phenyl]sulfide bishexafluoroantimonate, (2,4-cyclopentadiene-1-yl)[(1-methylethyl)benzene]-Fe-hexafluorophosphate and diphenyliodonium hexafluoroantimonate, which may be used alone or in combination.

Specific examples of the photo-cationic polymerization initiator include triphenylsulfonium hexafluoroantimonate types SP-170 (available from ADEKA Corporation), CPI-101A (available from San-Apro, Ltd.) and WPAG-1056 (available from Wako Pure Chemical Industries, Ltd.) and a diphenyliodonium hexafluoroantimonate type WPI-116 (available from Wako Pure Chemical industries, Ltd.)

The proportion of the photo-cationic polymerization initiator is preferably 0.1 to 3 parts by weight, more preferably 0.25 to 1 part by weight, based on 100 parts by weight of the resin component of the photosensitive epoxy resin composition. If the proportion of the photo-cationic polymerization initiator is excessively small, it will be difficult to impart the resin composition with satisfactory photocurability (UV-curability). If the proportion of the photo-cationic polymerization initiator is excessively great, the photosensitivity tends to be increased, resulting in abnormal shaping in the patterning. Further, the required physical properties associated with an initial loss tend to be deteriorated.

As required, the inventive photosensitive epoxy resin composition may contain additives in addition to the specific resin component and the photo-cationic polymerization initiator described above. Examples of the additives include an adhesiveness imparting agent such as a silane or titanium coupling agent, an olefin oligomer, a cycloolefin oligomer or polymer (e.g., a norbornene polymer or the like), a synthetic rubber or a silicone compound for enhancing the adhesiveness, various antioxidants such as a hindered phenol antioxidant and a phosphorus-containing antioxidant, a leveling agent and a defoaming agent. These additives may be properly blended, as long as the effects of the present disclosure are not impaired. These may be used alone or in combination.

The proportion of the antioxidant is preferably less than 3 parts by weight, particularly preferably not greater than 1 part by weight, based on 100 parts by weight of the resin component. If the proportion of the antioxidant is excessively great, the required physical properties associated with the initial loss tend to be deteriorated.

The inventive photosensitive epoxy resin composition can be prepared by mixing the specific resin component, the photo-cationic polymerization initiator and, as required, any of the additives in the predetermined proportions with stirring. Where the inventive photosensitive epoxy resin composition is prepared in the form of a coating varnish, the resulting mixture is preferably dissolved in an organic solvent with heating (e.g., to about 60° C. to about 120° C.) and stirring. The amount of the organic solvent to be used may be properly adjusted, and preferably set to, for example, 20 to 80 parts by weight, particularly preferably 30 to 60 parts by weight, based on 100 parts by weight of the resin component of the photosensitive epoxy resin composition. If the amount of the organic solvent to be used is excessively small, the prepared coating varnish tends to have a higher viscosity and hence poorer coatability. If the amount of the organic solvent to be used is excessively great, it will be difficult to form a thicker coating film with the use of the coating varnish.

Examples of the organic solvent to be used for the preparation of the coating varnish include ethyl lactate, methyl ethyl ketone, cyclohexanone, 2-butanone, N,N-dimethylacetamide, diglyme, diethylene glycol methyl ethyl ether, propylene glycol methyl acetate, propylene glycol monomethyl ether, tetramethylfurane and dimethoxyethane. These organic solvents may be used alone or in combination in a predetermined amount, for example, within the aforementioned range so as to impart the varnish with a viscosity suitable for the coating.

<<Optical Waveguide>>

Next, an optical waveguide will be described, which is produced by using the inventive photosensitive epoxy resin composition as a core layer forming material.

The inventive optical waveguide includes, for example, a substrate, a cladding layer (under-cladding layer) provided in a predetermined pattern on the substrate, a core layer provided in a predetermined pattern on the cladding layer for transmitting an optical signal, and another cladding layer (over-cladding layer) provided over the core layer. In the inventive optical waveguide, the core layer is formed from the photosensitive epoxy resin composition described above. Cladding layer forming resin compositions having the same formulation or different formulations may be used as an under-cladding layer forming material and an over-cladding layer forming material. In the inventive optical waveguide, the cladding layers are required to have a lower refractive index than the core layer.

In the present disclosure, the optical waveguide may be produced, for example, through the following process steps. A substrate is prepared, and a photosensitive varnish of a photosensitive resin composition as a cladding layer forming material is applied onto the substrate. The applied photosensitive varnish is cured by irradiating a varnish-applied surface with light such as ultraviolet radiation and, as required, performing a heat treatment. Thus, an under-cladding layer (lower cladding layer portion) is formed.

Then, a core layer forming material (photosensitive varnish) prepared by dissolving the inventive photosensitive epoxy resin composition in an organic solvent is applied onto the under-cladding layer to form an uncured core formation layer. After the application of the core layer forming material (photosensitive varnish), the organic solvent is removed by heat-drying. Thus, the optical waveguide formation photosensitive film is formed in an uncured film state. In turn, a photomask for light exposure in a predetermined pattern (optical waveguide pattern) is put on a surface of the uncured core formation layer. Then, the core formation layer is irradiated with light such as ultraviolet radiation via the photomask and, as required, heat-treated. Thereafter, an unexposed portion (uncured portion) of the uncured core formation layer is dissolved away with the use of a developing liquid, whereby a core layer is formed as having the predetermined pattern.

Subsequently, the photosensitive varnish of the photosensitive resin composition as the cladding layer forming material is applied over the core layer. Then, the cladding layer forming material is irradiated with light such as ultraviolet radiation and, as required, heat-treated, whereby an over-cladding layer (upper cladding layer portion) is formed. Thus, the intended optical waveguide is produced through these process steps.

Examples of the substrate include a silicon wafer, a metal substrate, a polymer film and a glass substrate. Examples of the metal substrate include stainless steel plates such as of JIS SUS. Specific examples of the polymer film include a polyethylene terephthalate (PET) film, a polyethylene naphthalate film and a polyimide film. The substrate typically has a thickness of 10 μm to 3 mm.

Specifically, the light irradiation may be irradiation with ultraviolet radiation. Exemplary ultraviolet light sources for the irradiation with the ultraviolet radiation include a low-pressure mercury lamp, a high-pressure mercury lamp and an ultrahigh-pressure mercury lamp. The dose of the ultraviolet radiation is typically about 10 to about 20000 mJ/cm$^2$, preferably about 100 to about 15000 mJ/cm$^2$, more preferably about 500 to about 10000 mJ/cm$^2$.

After the light exposure by the irradiation with the ultraviolet radiation or the like, the heat treatment may be further performed to complete a photoreaction for the curing. The heat treatment is typically performed at 80° C. to 250° C. for 10 seconds to 2 hours, preferably at 100° C. to 150° C. for 5 minutes to 1 hour.

The cladding layer forming material is, for example, an epoxy resin composition containing any of various liquid epoxy resins such as a bisphenol-A epoxy resin, a bisphenol-F epoxy resin, a hydrogenated bisphenol-A epoxy resin, a fluorinated epoxy resin and an epoxy-modified silicone resin, a solid epoxy resin such as a solid polyfunctional aliphatic epoxy resin, and any of the aforementioned photoacid generators. The formulation of the cladding layer forming material is properly designed so that the cladding layer forming material has a lower refractive index than the core layer forming material. For preparation of the cladding layer forming material to be applied in the form of a varnish, as required, any of conventionally known various organic solvents may be used in a proper amount so as to impart the varnish with a viscosity suitable for the application of the varnish, and various additives (an antioxidant, an adhesiveness imparting agent, a leveling agent and a UV absorbing agent) may be used in proper amounts as long as the functions of the optical waveguide produced by using the core layer forming material are not impaired.

Examples of the organic solvent to be used for the preparation of the varnish include ethyl lactate, methyl ethyl ketone, cyclohexanone, 2-butanone, N,N-dimethylacetamide, diglyme, diethylene glycol methyl ethyl ether, propylene glycol methyl acetate, propylene glycol monomethyl ether, tetramethylfurane and dimethoxyethane as in the aforementioned case. These organic solvents may be used alone or in combination in a proper amount so as to impart the varnish with a viscosity suitable for the application of the varnish.

Exemplary methods for the application of the forming materials for the respective layers on the substrate include coating methods employing a spin coater, a coater, a spiral coater, a bar coater or the like, a screen printing method, a capillary injection method in which the material is injected into a gap formed with the use of spacers by the capillary phenomenon, and a continuous R-to-R coating method employing a coating machine such as a multi-coater. The optical waveguide may be provided in the form of a film optical waveguide by removing the substrate.

The optical waveguide thus produced may be used as an optical waveguide, for example, for a hybrid flexible printed wiring board for optical/electrical transmission.

EXAMPLES

Next, the present disclosure will be described by way of examples thereof. However, it should be understood that the present disclosure be not limited to these examples. In the examples, the term "part(s)" means "part(s) by weight" unless otherwise specified.

Example 1

Prior to production of an optical waveguide according to the example, photosensitive varnishes were prepared as a cladding layer forming material and a core layer forming material.

<Preparation of Cladding Layer Forming Material>

Under shaded conditions, 80 parts of a liquid long-chain bifunctional semi-aliphatic epoxy resin (EXA-4816 available from DIC Corporation), 20 parts of a solid polyfunctional aliphatic epoxy resin (EHPE-3150 available from Daicel Corporation) and 2.0 parts of a photo-cationic polymerization initiator (photoacid generator) (ADEKAOPTOMER SP-170 available from ADEKA Corporation) were mixed with and completely dissolved in 40 parts of ethyl lactate at 85° C. with heating and stirring. Thereafter, the resulting solution was cooled to a room temperature (25° C.), and then filtered under higher-temperature and higher-pressure conditions with the use of a membrane filter having a pore diameter of 1.0 μm. Thus, a photosensitive varnish was prepared as the cladding layer forming material.

<Preparation of Core Layer Forming Material>

Under shaded conditions, 40 parts of a solid cresol novolak epoxy resin (YDCN-700-3 available from Nippon Steel & Sumikin Chemical Co., Ltd.), 40 parts of a solid bisphenol-A epoxy resin (JER1002 available from Mitsubishi Chemical Corporation), 20 parts of a solid fluorene skeleton-containing bifunctional epoxy resin (OGSOL PG-100 available from Osaka Gas Chemicals Co., Ltd.), 0.5 parts of a photo-cationic polymerization initiator (photoacid generator) (CPI-101A available from San-Apro, Ltd.), 0.5 parts of a hindered phenol antioxidant (Songnox1010 available from Kyodo Chemical Co., Ltd.) and 0.125 parts of a phosphate antioxidant (HCA available from Sanko Co., Ltd.) were mixed with and completely dissolved in 50 parts of ethyl lactate at 110° C. with heating and stirring. Thereafter, the resulting solution was cooled to a room temperature (25° C.), and then filtered under higher-temperature and higher-pressure conditions with the use of a membrane filter having a pore diameter of 1.0 μm. Thus, a photosensitive varnish was prepared as the core layer forming material.

<<Production of Optical Waveguide>>
<Formation of Under-Cladding Layer>

The photosensitive varnish prepared as the cladding layer forming material was applied onto a back surface of a flexible printed circuit (FPC) board substrate having an overall thickness of 22 μm by means of a spin coater, and then dried on a hot plate (at 130° C. for 10 minutes) for removal of the organic solvent. In turn, the resulting layer was exposed via a mask pattern by means of a UV irradiation machine (at 5000 mJ/cm² with an I-line filter), and further subjected to a post heat treatment (at 130° C. for 10 minutes). Subsequently, the resulting layer was developed in γ-butyrolactone (at a room temperature (25° C.) for 3 minutes) and rinsed with water, and then dried on a hot plate (at 120° C. for 5 minutes) for removal of water. Thus, an under-cladding layer (having a thickness of 15 μm) was formed.

<Formation of Core Layer>

The photosensitive varnish prepared as the core layer forming material was applied onto the thus formed under-cladding layer by means of a spin coater, and then dried (at 130° C. for 5 minutes) on a hot plate for removal of the organic solvent (ethyl lactate). Thus, an uncured layer (core formation layer) was formed in an uncured film state. The thus formed uncured layer (core formation layer) was subjected to mask pattern exposure (pattern width/pattern pitch (L/S)=50 μm/200 μm) at 8000 mJ/cm² (integrated at a wavelength of 365 nm) by means of a UV irradiation machine (mixed radiation without a band filter), and to a post-heat treatment (at 140° C. for 10 minutes). Thereafter, the resulting layer was developed in γ-butyrolactone (at a room temperature (25° C.) for 3 minutes), and rinsed with water. Then, the resulting layer was dried (at 120° C. for 5 minutes) on a hot plate for removal of water. Thus, a core layer (having a thickness of 50 μm) was formed in a predetermined pattern.

<Formation of Over-Cladding Layer>

The photosensitive varnish prepared as the cladding layer forming material was applied over the thus formed core layer by means of a spin coater, and then dried (at 130° C. for 10 minutes) on a hot plate for removal of the organic solvent (ethyl lactate). Thereafter, the resulting layer was exposed at 5000 mJ/cm² (with an I-line filter), and then subjected to a post-heat treatment (PEB process) at 130° C. for 10 minutes. Further, the resulting layer was developed in γ-butyrolactone (at a room temperature (25° C.) for 3 minutes) and rinsed with water, and then dried on a hot plate (at 120° C. for 10 minutes) for removal of water. Thus, an over-cladding layer (having a thickness of 10 μm on the core layer) was formed.

Thus, the optical waveguide (having an overall thickness of 75 μm) was produced, which included the under-cladding layer formed on the back surface of the FPC substrate, the core layer formed in the predetermined pattern on the under-cladding layer, and the over-cladding layer formed over the core layer.

Example 2

An optical waveguide was produced in substantially the same manner as in Example 1, except that, in the preparation of the photosensitive varnish as the core layer forming material, the formulation of the resin component was changed to include 50 parts of a solid cresol novolak epoxy resin (YDCN-700-3 available from Nippon Steel & Sumikin Chemical Co., Ltd.), 30 parts of a solid bisphenol-A epoxy resin (JER1002 available from Mitsubishi Chemical Corporation) and 20 parts of a solid fluorene skeleton-containing bifunctional epoxy resin (OGSOL PG-100 available from Osaka Gas Chemicals Co., Ltd.)

Example 3

An optical waveguide was produced in substantially the same manner as in Example 1, except that, in the preparation of the photosensitive varnish as the core layer forming material, the formulation of the resin component was changed to include 55 parts of a solid cresol novolak epoxy resin (YDCN-700-3 available from Nippon Steel & Sumikin Chemical Co., Ltd.), 30 parts of a solid bisphenol-A epoxy resin (JER1002 available from Mitsubishi Chemical Corporation) and 15 parts of a solid fluorene skeleton-containing bifunctional epoxy resin (OGSOL PG-100 available from Osaka Gas Chemicals Co., Ltd.)

Example 4

An optical waveguide was produced in substantially the same manner as in Example 1, except that, in the preparation of the photosensitive varnish as the core layer forming material, the formulation of the resin component was changed to include 60 parts of a solid cresol novolak epoxy resin (YDCN-700-3 available from Nippon Steel & Sumikin Chemical Co., Ltd.), 20 parts of a solid bisphenol-A epoxy resin (JER1002 available from Mitsubishi Chemical Corporation) and 20 parts of a solid fluorene skeleton-containing bifunctional epoxy resin (OGSOL PG-100 available from Osaka Gas Chemicals Co., Ltd.)

Example 5

An optical waveguide was produced in substantially the same manner as in Example 1, except that, in the preparation of the photosensitive varnish as the core layer forming material, the formulation of the resin component was changed to include 50 parts of a solid cresol novolak epoxy resin (YDCN-700-5 available from Nippon Steel & Sumikin Chemical Co., Ltd.), 30 parts of a solid bisphenol-A epoxy resin (JER1002 available from Mitsubishi Chemical Corporation) and 20 parts of a solid fluorene skeleton-containing bifunctional epoxy resin (OGSOL PG-100 available from Osaka Gas Chemicals Co., Ltd.)

Example 6

An optical waveguide was produced in substantially the same manner as in Example 1, except that, in the preparation of the photosensitive varnish as the core layer forming material, the formulation of the resin component was changed to include 50 parts of a solid cresol novolak epoxy resin (YDCN-700-7 available from Nippon Steel & Sumikin Chemical Co., Ltd.), 30 parts of a solid bisphenol-A epoxy resin (JER1002 available from Mitsubishi Chemical Corporation) and 20 parts of a solid fluorene skeleton-containing bifunctional epoxy resin (OGSOL PG-100 available from Osaka Gas Chemicals Co., Ltd.)

Example 7

An optical waveguide was produced in substantially the same manner as in Example 1, except that, in the preparation of the photosensitive varnish as the core layer forming material, the formulation of the resin component was changed to include 50 parts of a solid cresol novolak epoxy resin (YDCN-700-10 available from Nippon Steel & Sumikin Chemical Co. Ltd.), 30 parts of a solid bisphenol-A epoxy resin (JER1002 available from Mitsubishi Chemical Corporation) and 20 parts of a solid fluorene skeleton-containing bifunctional epoxy resin (OGSOL PG-100 available from Osaka Gas Chemicals Co., Ltd.)

Example 8

An optical waveguide was produced in substantially the same manner as in Example 1, except that, in the preparation of the photosensitive varnish as the core layer forming material, the formulation of the resin component was changed to include 60 parts of a solid cresol novolak epoxy resin (YDCN-700-3 available from Nippon Steel & Sumikin Chemical Co., Ltd.), 20 parts of a solid bisphenol-A epoxy resin (JER1003 available from Mitsubishi Chemical Corporation) and 20 parts of a solid fluorene skeleton-containing bifunctional epoxy resin (OGSOL PG-100 available from Osaka Gas Chemicals Co., Ltd.)

Example 9

An optical waveguide was produced in substantially the same manner as in Example 1, except that, in the preparation of the photosensitive varnish as the core layer forming material, the formulation of the resin component was changed to include 65 parts of a solid cresol novolak epoxy resin (YDCN-700-3 available from Nippon Steel & Sumikin Chemical Co., Ltd.), 15 parts of a solid bisphenol-A epoxy resin (JER1002 available from Mitsubishi Chemical Corporation) and 20 parts of a solid fluorene skeleton-containing bifunctional epoxy resin (OGSOL PG-100 available from Osaka Gas Chemicals Co., Ltd.)

Example 10

An optical waveguide was produced in substantially the same manner as in Example 1, except that, in the preparation of the photosensitive varnish as the core layer forming material, the formulation of the resin component was changed to include 35 parts of a solid cresol novolak epoxy resin (YDCN-700-3 available from Nippon Steel & Sumikin Chemical Co., Ltd.), 45 parts of a solid bisphenol-A epoxy resin (JER1002 available from Mitsubishi Chemical Corporation) and 20 parts of a solid fluorene skeleton-containing bifunctional epoxy resin (OGSOL PG-100 available from Osaka Gas Chemicals Co., Ltd.)

Example 11

An optical waveguide was produced in substantially the same manner as in Example 1, except that, in the preparation of the photosensitive varnish as the core layer forming material, the formulation of the resin component was changed to include 60 parts of a solid cresol novolak epoxy resin (YDCN-700-3 available from Nippon Steel & Sumikin Chemical Co., Ltd.), 30 parts of a solid bisphenol-A epoxy resin (JER1002 available from Mitsubishi Chemical Corporation) and 10 parts of a solid fluorene skeleton-containing bifunctional epoxy resin (OGSOL PG-100 available from Osaka Gas Chemicals Co., Ltd.)

Example 12

An optical waveguide was produced in substantially the same manner as in Example 1, except that, in the preparation of the photosensitive varnish as the core layer forming material, the formulation of the resin component was changed to include 55 parts of a solid cresol novolak epoxy resin (YDCN-700-3 available from Nippon Steel & Sumikin Chemical Co., Ltd.), 20 parts of a solid bisphenol-A epoxy resin (JER1002 available from Mitsubishi Chemical Corporation) and 25 parts of a solid fluorene skeleton-containing bifunctional epoxy resin (OGSOL PG-100 available from Osaka Gas Chemicals Co., Ltd.)

Comparative Example 1

An optical waveguide was produced in substantially the same manner as in Example 1, except that, in the preparation of the photosensitive varnish as the core layer forming material, the formulation of the resin component was changed to include 65 parts of a solid cresol novolak epoxy resin (YDCN-700-3 available from Nippon Steel & Sumikin Chemical Co., Ltd.), 15 parts of a liquid bisphenol-A epoxy resin (JER828 available from Mitsubishi Chemical Corporation) and 20 parts of a solid fluorene skeleton-containing bifunctional epoxy resin (OGSOL PG-100 available from Osaka Gas Chemicals Co., Ltd.)

Comparative Example 2

An optical waveguide was produced in substantially the same manner as in Example 1, except that, in the preparation of the photosensitive varnish as the core layer forming material, the formulation of the resin component was changed to include 60 parts of a solid cresol novolak epoxy resin (YDCN-700-3 available from Nippon Steel & Sumikin Chemical Co., Ltd.), 30 parts of a solid bisphenol-A epoxy resin (JER1002 available from Mitsubishi Chemical Corporation) and 10 parts of a liquid fluorene skeleton-containing bifunctional epoxy resin (OGSOL EG-200 available from Osaka Gas Chemicals Co., Ltd.)

The photosensitive varnishes thus prepared as the core layer forming materials and the optical waveguides thus produced were evaluated for the R-to-R adaptability, the core layer refractive index, the optical waveguide loss (linear loss), the varnish stability and comprehensive evaluation by performing measurement in the following manner. The results are shown below together with the formulations of the respective core layer forming materials in Tables 1 and 2.

[R-to-R Adaptability]

The photosensitive varnishes prepared as the core layer forming materials in Examples and Comparative Examples were evaluated through the following measurement.

(1) Tackiness

The core layer forming materials (photosensitive varnishes) were each applied onto a silicon wafer, and then the resulting silicon wafer was prebaked (heat-dried) at 130° C. for 5 minutes. Thus, a coating film having a thickness of about 50 µm was formed. A surface of the coating film was touched with a finger for 10 seconds and, when the finger was released from the coating film, the state of the surface was checked for tackiness.

(2) Flexibility of Uncured Product (Uncured Film)

The core layer forming materials (photosensitive varnishes) were each applied onto a polyethylene terephthalate (PET) substrate, and then heat-dried (at 130° C. for 5 minutes). Thus, an uncured film (amorphous film) having a thickness of about 50 µm was formed. Then, the amorphous film on the PET substrate was rolled around an 8-cm diameter roll core and a 4-cm diameter roll core, and checked for cracking.

(3) Flexibility of Cured Product (Cured Film)

The core layer forming materials (photosensitive varnishes) were each applied onto a PET substrate, and then heat-dried (at 130° C. for 5 minutes). Thus, an uncured film (amorphous film) having a thickness of about 50 µm was formed. Subsequently, the amorphous film on the PET substrate was exposed to mixed radiation at 8000 mJ/cm$^2$ based on illuminance at a wavelength of 365 nm (by means of an ultrahigh-pressure mercury lamp without a band pass filter) through a 5-mm thick glass mask (having no pattern), and then subjected to a post-heat treatment at 140° C. for 10 minutes. Thus, a cured film was formed. The cured film thus formed on the PET substrate was rolled around an 8-cm diameter roll core and a 4-cm diameter roll core with the cured film outside, and visually checked for cracking.

Based on the results of the checking of the respective measurement items, the core layer forming materials were each rated according to the following criteria:
Excellent (○): The coating film was free from tackiness, and the uncured film and the cured film were free from cracking when being rolled around the 4-cm diameter roll core.
Acceptable (Δ): The coating film was free from tackiness. The uncured film and the cured film were free from cracking when being rolled around the 8-cm diameter roll core, but the cured film suffered from cracking when being rolled around the 4-cm diameter roll core.
Unacceptable (x): The coating film suffered from tackiness.

[Refractive Index]

The core layer forming materials (photosensitive varnishes) were each applied onto a 0.8-mm thick silicon wafer by means of a spin coater, and then heat-dried at 130° C. for 10 minutes. Subsequently, the resulting film was exposed to mixed radiation at 8000 mJ/cm$^2$ based on illuminance at 365 nm (by means of an ultrahigh-pressure mercury lamp without a band pass filter) through a 5-mm thick glass mask (having no pattern), and then subjected to a post-heat treatment at 140° C. for 10 minutes. Thus, a sample (having a thickness of 10 for refractive index evaluation was prepared. The refractive index of the sample thus prepared was measured at a wavelength of 850 nm by means of a prism coupler (SPA-4000) available from SAIRON TECHNOLOGY, Inc. Based on the results, the sample was rated according to the following criteria:
Excellent (○): The refractive index was not lower than 1.590 at a wavelength of 850 nm.
Acceptable (Δ): The refractive index was not lower than 1.585 and lower than 1.590 at a wavelength of 850 nm.
Unacceptable (x): The refractive index was lower than 1.585 at a wavelength of 850 nm.

[Evaluation for Optical Waveguide Loss (Linear Loss)]

The optical waveguides produced in Examples and Comparative Examples were each used as a sample. Light emitted from a light source (850-nm VCSEL light source OP250 available from Miki Inc.) was collected and inputted into the sample through a multi-mode fiber (FFP-G120-0500 available from Miki Inc.) having an MMF diameter of 50 μm and an NA of 0.2. Then, light outputted from the sample was collected by a lens (FH14-11 available from Seiwa Optical Co., Ltd.) having a magnification of 20 and an NA of 0.4, and detected at 6 channels by a light measurement system (optical multi-power meter Q8221 available from Advantest Corporation) for evaluation. A linear loss was calculated from an average total loss for the 6 channels. Based on the linear loss thus calculated, a linear loss value per unit length was calculated by a cutback method. Based on the loss value, the sample was rated according to the following criteria:
Excellent (○): The linear loss value was less than 0.05 dB/cm.
Acceptable (Δ): The linear loss value was not less than 0.05 dB/cm and not greater than 0.06 dB/Cm.
Unacceptable (x): The linear loss value was greater than 0.06 dB/cm.

[Varnish Stability]

The prepared core layer forming materials (photosensitive varnishes) were each allowed to stand still under predetermined conditions (stored at 5° C. in a refrigerator), and then checked for turbidity. Based on the results, the varnishes were each rated according to the following criteria:
Excellent (○): The varnish was free from turbidity even after being allowed to stand still at 5° C. in the refrigerator for more than 1 week.
Acceptable (Δ): The varnish was free from turbidity when being allowed to stand still at 5° C. in the refrigerator for 1 week.
Unacceptable (x): The varnish suffered from turbidity when being cooled after being heated for the preparation thereof.

[Comprehensive Evaluation]

Based on the above evaluation results, comprehensive evaluation was performed according to the following criteria:
Excellent (○): All the ratings of the evaluation items were excellent (○).
Acceptable (Δ): At least one of the ratings of the evaluation items was acceptable (Δ).
Unacceptable (x): At least one of the ratings of the evaluation items was unacceptable (x).

TABLE 1

| | | | | | | | Example | | | | (parts) |
|---|---|---|---|---|---|---|---|---|---|---|---|
| Category | Product name | State | Softening point | 1 | 2 | 3 | 4 | 5 | 6 | 7 |
| Cresol novolak epoxy resin (a) | YDCN-700-3 | Solid | 59° C. to 65° C. | 40 | 50 | 55 | 60 | — | — | — |
| | YDCN-700-5 | | 66° C. to 72° C. | — | — | — | — | 50 | — | — |
| | YDCN-700-7 | | 70° C. to 76° C. | — | — | — | — | — | 50 | — |
| | YDCN-700-10 | | 75° C. to 85° C. | — | — | — | — | — | — | 50 |
| Bisphenol-A epoxy resin (b) | JER1002 | Solid | 78° C. | 40 | 30 | 30 | 20 | 30 | 30 | 30 |
| | JER1003 | | 89° C. | — | — | — | — | — | — | — |
| | JER828 | Liquid | Liquid at ordinary temperature | — | — | — | — | — | — | — |
| Fluorene skeleton-containing epoxy resin (c) | OGSOL PG-100 | Solid | — | 20 | 20 | 15 | 20 | 20 | 20 | 20 |
| | OGSOL EG-200 | Liquid | Liquid at ordinary temperature | — | — | — | — | — | — | — |
| Photoacid generator | CPI-101A | — | — | 0.5 | 0.5 | 0.5 | 0.5 | 0.5 | 0.5 | 0.5 |
| Antioxidant | Songnox 1010 | — | — | 0.5 | 0.5 | 0.5 | 0.5 | 0.5 | 0.5 | 0.5 |
| | HCA | — | — | 0.125 | 0.125 | 0.125 | 0.125 | 0.125 | 0.125 | 0.125 |
| Organic solvent (ethyl lactate) | | — | — | 50 | 50 | 50 | 50 | 50 | 50 | 50 |
| R-to-R adaptability | | | | ○ | ○ | ○ | ○ | Δ | Δ | Δ |
| Refractive index | | | | ○ | ○ | ○ | ○ | ○ | ○ | ○ |
| Linear loss | | | | ○ | ○ | ○ | ○ | ○ | ○ | ○ |
| Varnish stability | | | | ○ | ○ | ○ | ○ | ○ | ○ | ○ |
| Comprehensive evaluation | | | | ○ | ○ | ○ | ○ | Δ | Δ | Δ |

TABLE 2

| Category | Product name | State | Softening point | Example 8 | 9 | 10 | 11 | 12 | Comparative Example 1 | 2 |
|---|---|---|---|---|---|---|---|---|---|---|
| Cresol novolak epoxy resin (a) | YDCN-700-3 | Solid | 59° C. to 65° C. | 60 | 65 | 35 | 60 | 55 | 65 | 60 |
| | YDCN-700-5 | | 66° C. to 72° C. | — | — | — | — | — | — | — |
| | YDCN-700-7 | | 70° C. to 76° C. | — | — | — | — | — | — | — |
| | YDCN-700-10 | | 75° C. to 85° C. | — | — | — | — | — | — | — |
| Bisphenol-A epoxy resin (b) | JER1002 | Solid | 78° C. | — | 15 | 45 | 30 | 20 | — | 30 |
| | JER1003 | | 89° C. | 20 | — | — | — | — | — | — |
| | JER828 | Liquid | Liquid at ordinary temperature | — | — | — | — | — | 15 | — |
| Fluorene skeleton-containing epoxy resin (c) | OGSOL PG-100 | Solid | — | 20 | 20 | 20 | 10 | 25 | 20 | — |
| | OGSOL EG-200 | Liquid | Liquid at ordinary temperature | — | — | — | — | — | — | 10 |
| Photoacid generator | CPI-101A | — | — | 0.5 | 0.5 | 0.5 | 0.5 | 0.5 | 0.5 | 0.5 |
| Antioxidant | Songnox 1010 | — | — | 0.5 | 0.5 | 0.5 | 0.5 | 0.5 | 0.5 | 0.5 |
| | HCA | — | — | 0.125 | 0.125 | 0.125 | 0.125 | 0.125 | 0.125 | 0.125 |
| Organic solvent | (ethyl lactate) | — | — | 50 | 50 | 50 | 50 | 50 | 50 | 50 |
| R-to-R adaptability | | | | Δ | Δ | ○ | ○ | ○ | x | x |
| Refractive index | | | | ○ | ○ | ○ | Δ | ○ | ○ | x |
| Linear loss | | | | ○ | ○ | Δ | ○ | ○ | ○ | ○ |
| Varnish stability | | | | ○ | ○ | ○ | ○ | Δ | ○ | ○ |
| Comprehensive evaluation | | | | Δ | Δ | Δ | Δ | Δ | x | x |

The above results indicate that the photosensitive epoxy resin compositions (Examples) each prepared by using the solid epoxy resin component alone as the resin component were excellent in R-to-R adaptability and varnish stability and each ensured a higher refractive index. Further, the optical waveguides including the core layers respectively formed by using the photosensitive epoxy resin compositions (Examples) were each rated as excellent in optical waveguide loss evaluation (linear loss evaluation). Examples 1 to 4 each employing the solid cresol novolak epoxy resin (YDCN-700-3 available from Nippon Steel & Sumikin Chemical Co., Ltd.) having a softening point of not higher than 65° C., the solid bisphenol-A epoxy resin (JER1002 available from Mitsubishi Chemical Corporation) having a softening point of not higher than 80° C. and the solid fluorene skeleton-containing bifunctional epoxy resin (OGSOL PG-100 available from Osaka Gas Chemicals Co., Ltd.) in predetermined proportions were excellent in all the evaluation items, and rated as particularly excellent.

In contrast, the photosensitive epoxy resin compositions (Comparative Examples) each prepared by using the liquid epoxy resin together with the solid epoxy resin as the resin component were inferior in R-to-R adaptability. Further, Comparative Example 2 was inferior in refractive index.

While specific forms of the embodiments of the present disclosure have been shown in the aforementioned inventive examples, the inventive examples are merely illustrative of the disclosure but not limitative of the disclosure. It is contemplated that various modifications apparent to those skilled in the art could be made within the scope of the disclosure.

The inventive optical waveguide formation photosensitive epoxy resin composition is useful as a material for formation of a core layer of an optical waveguide. The optical waveguide produced by using the optical waveguide formation photosensitive epoxy resin composition as a core layer forming material is used, for example, for a hybrid flexible printed wiring board or the like for optical/electrical transmission.

The invention claimed is:

1. A photosensitive photocurable epoxy resin composition for formation of an optical waveguide, the composition comprising:
   an epoxy resin; and
   a photo-cationic polymerization initiator;
   wherein the epoxy resin includes a solid epoxy resin component alone, and
   wherein the epoxy resin comprises:
   (a) a solid cresol novolak epoxy resin;
   (b) a solid bisphenol-A epoxy resin; and
   (c) a solid fluorene skeleton-containing epoxy resin.

2. The photosensitive photocurable epoxy resin composition according to claim 1, wherein the solid cresol novolak epoxy resin (a), the solid bisphenol-A epoxy resin (b) and the solid fluorene skeleton-containing epoxy resin (c) are present in proportions of (a) 40 to 60 parts by weight, (b) 20 to 40 parts by weight and (c) 15 to 20 parts by weight, respectively, based on 100 parts by weight of a total weight (a)+(b)+(c) of the resins (a), (b) and (c).

3. The photosensitive photocurable epoxy resin composition according to claim 1, wherein the solid cresol novolak epoxy resin (a) has a softening point of not higher than 65° C.

4. The photosensitive photocurable epoxy resin composition according to claim 1, wherein the solid bisphenol-A epoxy resin (b) has a softening point of not higher than 80° C.

5. The photosensitive photocurable epoxy resin composition according to claim 1, wherein the composition is a core-layer-forming material for an optical waveguide including a substrate, a cladding layer provided on the substrate and a core layer provided in a predetermined pattern in the cladding layer for transmission of an optical signal.

6. A photosensitive film for formation of an optical waveguide, which is produced by forming the photosensitive photocurable epoxy resin composition according to claim 1 into a film.

7. An optical waveguide comprising:

a substrate;

a cladding layer provided on the substrate; and a core layer provided in a predetermined pattern in the cladding layer for transmission of an optical signal;

wherein the core layer is a core layer formed by curing the photosensitive photocurable epoxy resin composition according to claim 1.

8. A hybrid flexible printed wiring board for optical/electrical transmission, comprising the optical waveguide according to claim 7.

9. An optical waveguide comprising:

a substrate;

a cladding layer provided on the substrate; and a core layer provided in a predetermined pattern in the cladding layer for transmission of an optical signal;

wherein the core layer is a core layer formed by curing the photosensitive film according to claim 6.

10. A hybrid flexible printed wiring board for optical/electrical transmission, comprising the optical waveguide according to claim 9.

* * * * *